(12) United States Patent
Utsumi et al.

(10) Patent No.: US 7,859,084 B2
(45) Date of Patent: Dec. 28, 2010

(54) SEMICONDUCTOR SUBSTRATE

(75) Inventors: Masaki Utsumi, Kadoma (JP); Takahiro Kumakawa, Kadoma (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/391,671

(22) Filed: Feb. 24, 2009

(65) Prior Publication Data

US 2009/0218660 A1 Sep. 3, 2009

(30) Foreign Application Priority Data

Feb. 28, 2008 (JP) .............................. 2008-046971
Feb. 28, 2008 (JP) .............................. 2008-046972

(51) Int. Cl.
*H01L 23/544* (2006.01)
(52) U.S. Cl. ..................... 257/620; 257/622; 257/623
(58) Field of Classification Search ................ 257/620, 257/622, 623
See application file for complete search history.

(56) References Cited

U.S. PATENT DOCUMENTS 3,795,045 A * 3/1974 Dumas ..................... 438/17
6,774,500 B1 * 8/2004 Nakayama ................. 257/788
7,126,225 B2 * 10/2006 Su et al. .................... 257/775
2007/0190748 A1 8/2007 Nakamura ................. 438/460
2007/0264803 A1 11/2007 Kumakawa ................ 438/478

FOREIGN PATENT DOCUMENTS

| JP | 4-109537 | 9/1992 |
|---|---|---|
| JP | 2001-127008 | 5/2001 |
| JP | 2002-192370 | 7/2002 |
| JP | 2004-165227 | 6/2004 |
| JP | 2004-186340 | 7/2004 |

* cited by examiner

*Primary Examiner*—Phuc T Dang
(74) *Attorney, Agent, or Firm*—Steptoe & Johnson LLP

(57) ABSTRACT

A semiconductor substrate (1) includes a plurality of semiconductor elements (2) in which functional elements are constructed and which is formed in a grid pattern, wherein continuous linear grooves (3) are formed on longitudinal and lateral separating lines (4) that individually separate the plurality of semiconductor elements (2) with the exception of intersections of the separating lines (4) and portions corresponding to corners of each semiconductor element (2).

3 Claims, 13 Drawing Sheets

(a)

(b)

(c)

(d)

(e)

(f)

SEMICONDUCTOR SUBSTRATE

FIELD OF THE INVENTION

The present invention relates to a semiconductor substrate, a semiconductor device, and a method of manufacturing the same.

BACKGROUND OF THE INVENTION

Semiconductor devices having partially-thinned structures as typified by MEMS (microelectromechanical system) include MEMS pressure sensors and MEMS accelerometers. Generally, a plurality of such sensors is concurrently formed in a semiconductor wafer process so as to acquire a diaphragm structure or a beam structure, and is subsequently individually separated. As for the separation, the most common method involves rotating a circular dicing saw to which diamond or c-BN particles are secured at high speed to perform a fracturing process. The process is performed while running water for removing fractured waste and suppressing frictional heat. However, since diaphragm structures and beam structures are structurally fragile, there is a risk that the pressure generated by the water may destroy the structures.

Recently, processing using a laser beam has received attention as a separation method not requiring water. Japanese Patent No. 3408805 discloses a method involving using a laser beam to form a modified region in a semiconductor substrate through multiple photon absorption and performing separation at cleavages originating at the modified region. Multiple photon absorption is a phenomenon in which absorption occurs in a material when light intensity is significantly increased even in a case where light energy is lower than an absorption band gap of the material or, in other words, in a case of entering an optically transmissive state.

For example, as shown in FIGS. 19A and 19B, a focal point of a laser beam 108 is set to the inside of a semiconductor substrate 101 at a portion of a separating line 104 that individually separates a plurality of semiconductor elements 102 formed on the semiconductor substrate 101 to cause multiple photon absorption in a thickness direction. Subsequently, by scanning the laser beam 108 along the separating line 104 so as to continuously or intermittently cause such multiple photon absorption, a modified region 109 along the separating line 104 is formed inside the substrate and a crack 110 originating at the modified region 109 is created. With this arrangement, by simultaneously applying external force on both sides of the separating line 104, the semiconductor substrate 101 can be easily split even with a relatively small external force. In a case where the semiconductor substrate 101 is thin, splitting occurs naturally at the crack 110 even when no external force is applied.

However, with this method, if the semiconductor substrate 101 is thick, splitting cannot be achieved depending on the modified region 109 produced by a single scan. Therefore, a plurality of scans must be performed so as to approximately serially align the modified regions 109 of the respective scans in a thickness direction, resulting in an increase in process takt.

Another method is to reduce the thickness of a processed portion by forming, in advance, a groove on a separating line through anisotropic etching or the like. For example, in a method disclosed in Japanese Patent Laid-Open No. 2001-127008, anisotropic etching is performed after forming an etching protective film on a semiconductor substrate on a (100)-oriented surface so as to expose longitudinal and lateral separating line portions. As a result, etching is stopped at a (111)-oriented surface and a V-groove having an inclination angle of 54.7 degrees is formed. By applying external force on the semiconductor substrate so as to expand the V-groove, the semiconductor substrate can be separated along the V-groove, i.e., along the separating line.

However, with this method, since the erosion due to anisotropic etching of portions at which the longitudinal and lateral V-grooves intersect differs from the erosion of other portions, excessive etching may prevent etching from stopping at the (111)-oriented surface and etching may proceed to a (211)-oriented surface. For example, when concurrently forming V-grooves in a process of forming a diaphragm structure requiring deeper etching than that required for V-grooves, intersecting portions of the V-grooves end up being excessively etched, sometimes to the extent of penetrating the semiconductor substrate. Consequently, the strength of the semiconductor substrate deteriorates significantly, causing the semiconductor substrate to break during handling.

Japanese Patent Laid-Open No. 2004-186340 discloses the formation of continuous-line first grooves and broken-line second grooves as scribe grooves on separating lines on a substrate. Japanese Utility Model Laid-Open No. H04-109537 discloses the formation of continuous cut grooves and discontinuous cut grooves on separating lines of a substrate on which a semiconductor device having a diaphragm is formed. However, in the case as described above where only grooves on separating lines in either the longitudinal direction or the lateral direction are formed as continuous grooves, since the continuous grooves are not uniformly disposed with respect to the four sides of individual semiconductor devices to be separated, stress tends to concentrate on sides on which the continuous grooves are formed and damage originating at such sides may occur in the semiconductor device. The formation of continuous grooves causes deterioration in strength and may lead to damage to the semiconductor substrate during handling.

Japanese Patent Laid-Open No. 2004-165227 discloses the formation of two grooves on separating lines on a substrate corresponding to each of the four sides of each semiconductor device. However, in this case, since the grooves are not continuous, the rectilinearity of separation decreases, resulting in nonuniform shapes of semiconductor devices after separation and, in particular, inhomogeneous dimensions of the respective sides. As a result, for example, the pick-up rate of collets picked up at the sides of semiconductor devices in a subsequent process declines, resulting in lower productivity.

DISCLOSURE OF INVENTION

The present invention is made in consideration of the disadvantages described above, and an object thereof is to improve process takt without decreasing separation quality when separating a semiconductor substrate on which a plurality of semiconductor elements are formed into individual semiconductor elements and forming individual semiconductor devices.

In order to achieve the object, a semiconductor substrate according to the present invention is a semiconductor substrate on which a plurality of semiconductor elements in which functional elements are constructed are formed in a grid pattern, wherein linear grooves are formed on longitudinal and lateral separating lines that individually separate the plurality of semiconductor elements with the exception of intersections of the separating lines.

Furthermore, a method of manufacturing a semiconductor device according to the present invention includes the steps of: forming linear grooves by anisotropic etching, in a semiconductor substrate on which a plurality of semiconductor elements in which functional elements are constructed are formed in a grid pattern, on longitudinal and lateral separating lines that individually separate the plurality of semiconductor elements with the exception of intersections of the separating lines; forming a modified region inside the substrate by irradiating, after forming the grooves, a laser beam along each separating line while at the same time focusing the laser beam to the inside of the substrate; and forming individual semiconductor devices by applying, after forming the modified region, external force to the semiconductor substrate to separate the semiconductor substrate along each separating line.

As described above, since grooves are formed with the exception of intersections of the separating lines or, in other words, since groove intersections where it is extremely difficult to control etching have been removed, the formation of grooves can be performed in an extremely easy and stable manner. In addition, since a structure is achieved in which the substrate is thin at the groove portions and stress can be more readily concentrated during separation using cleavages or the like, separation can now be performed with good rectilinearity and in a stable manner.

The grooves can be continuously formed with the exception of portions corresponding to corners of each semiconductor element. Additionally, the grooves can be continuously formed with the exception of portions corresponding to the outer periphery of each semiconductor element. A structure may be adopted in which the substrate is partially thinned, such as a diaphragm structure having a depression on a rear face-side of each semiconductor element.

In the step of forming a modified region, the number of laser beam scans on a groove formation portion can be set lower than the number of laser beam scans on a groove non-formation portion.

When the method of manufacturing a semiconductor device according to the present invention includes the step of forming a depression constituting a diaphragm structure on a rear face-side of each semiconductor element by anisotropic etching, the step of forming the grooves can be performed concurrently with the step of forming the depression.

A semiconductor device manufactured as described above and having a notched portion that is continuous with the exception of corners, on each side of the rear face of a substrate opposite to a semiconductor element also constitutes a part of the present invention. By providing the notched portion, a die bond material can be kept from creeping up to a device-side face during mounting of the substrate. Meanwhile, since notched portions are absent in corners, there is no decrease in area of the rear face of the device and bonding area can be secured. A semiconductor device having a diaphragm structure provided with a depression on a rear face-side of the semiconductor element also constitutes a part of the present invention.

DESCRIPTION OF THE EMBODIMENTS

An embodiment of the present invention will now be described with reference to the drawings.

In FIGS. 1 to 4, a semiconductor substrate 1 is made up of Si monocrystals, and a plurality of semiconductor elements 2 in which functional elements are constructed are formed in a grid pattern on one of the faces of the semiconductor substrate 1. The portions of the semiconductor elements 2 become diaphragm pressure sensors (semiconductor devices) after separation. As such, the semiconductor elements 2 themselves are made thin so as to become sensing sections, while depressions 5 are formed on rear face-sides of the semiconductor elements 2, constituting diaphragm structures. An example of such a diaphragm pressure sensor is a microphone sensor, in which air vibrated by sound vibrates a diaphragm, and the displacement of the diaphragm varies the capacity of a conductor between a receiving-side diaphragm and a vibrating-side diaphragm to convert the sound into a vibrational frequency and an electrical signal.

Separating lines 4 separating the plurality of semiconductor elements 2 extend in longitudinal and lateral directions so as to bisect each other at right angles. Linear grooves 3 are formed on the respective separating lines 4 with the exception of the intersections of the separating lines 4. In this case, the grooves 3 are continuously formed on the separating lines 4 along the respective sides of the semiconductor elements 2 with the exception of corners of the semiconductor elements 2.

The semiconductor substrate 1 and a method of manufacturing a semiconductor device from the semiconductor substrate 1 will now be described.

Figure 1:
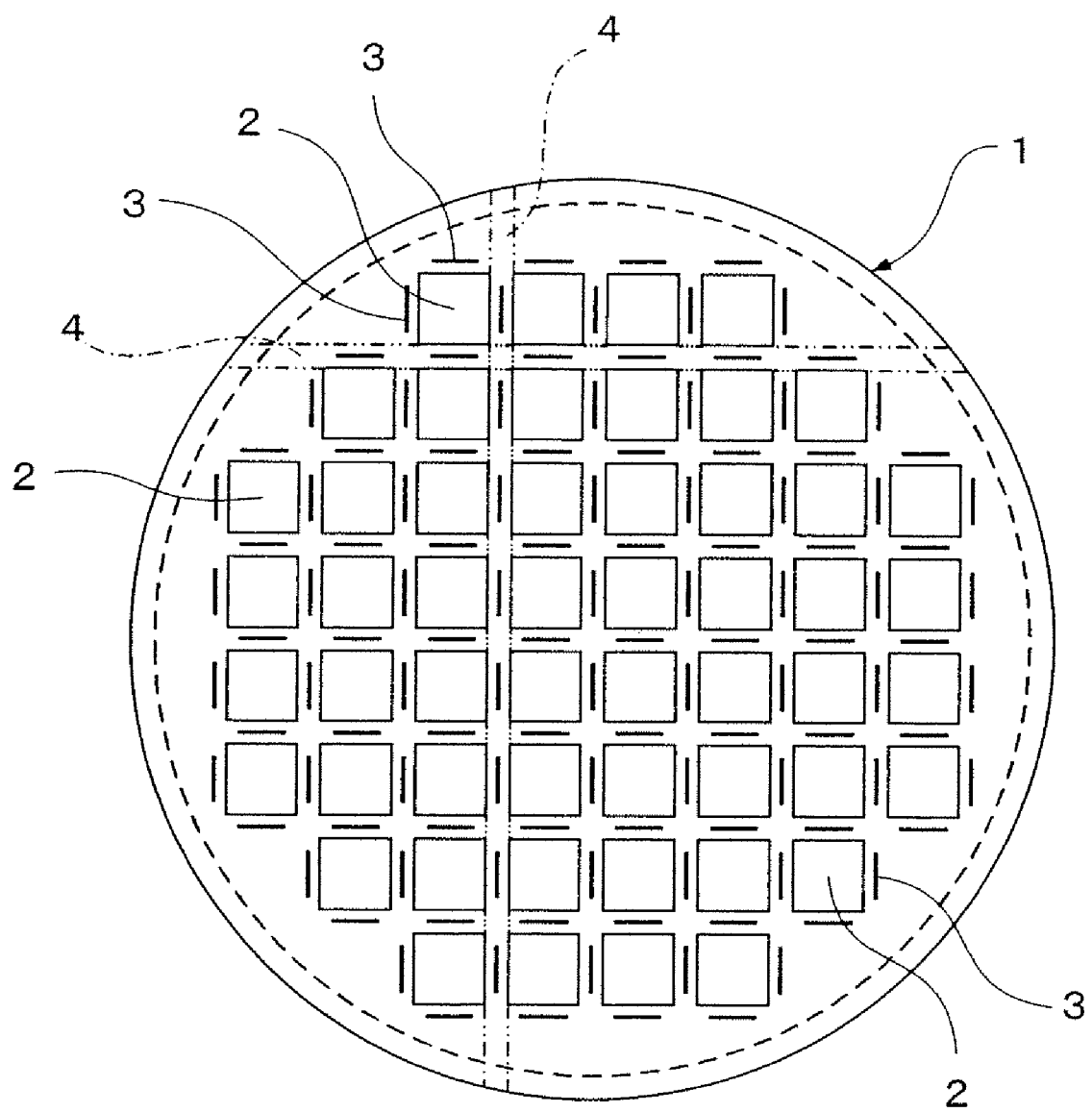
FIG. 1 is a plan view of a semiconductor substrate according to an embodiment of the present invention.
Figure 2:
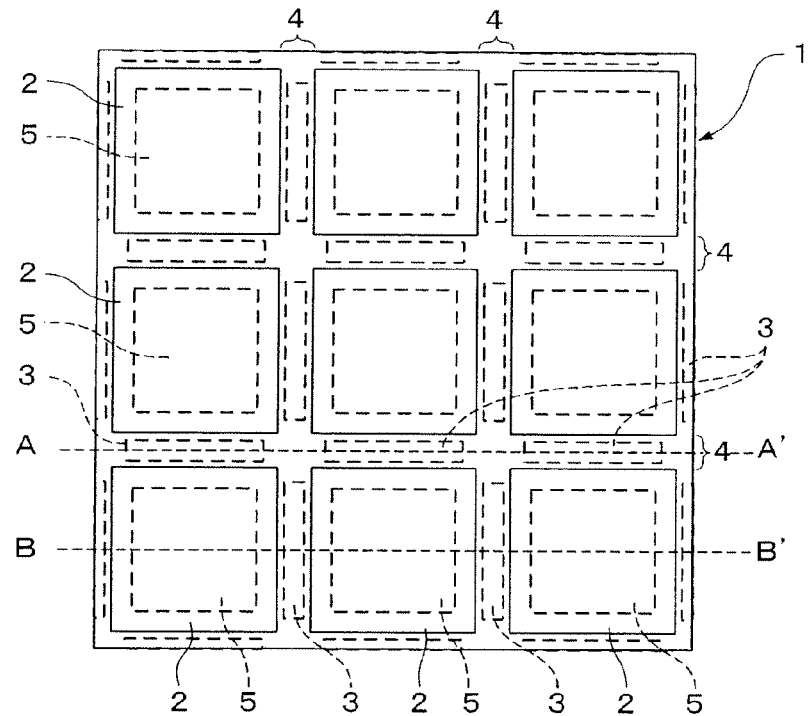
FIG. 2 is a partial enlarged plan view showing the semiconductor substrate.
Figure 3:
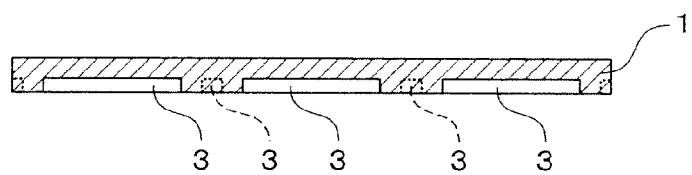
FIG. 3 is a cross-sectional view of the semiconductor substrate taken along A-A' in FIG. 2.
Figure 4:
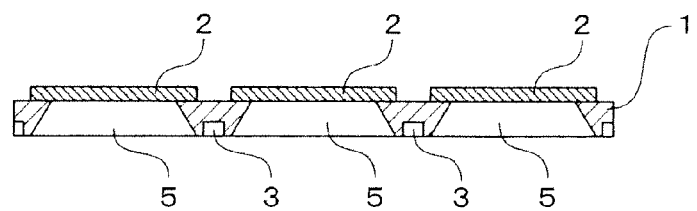
FIG. 4 is a cross-sectional view of the semiconductor substrate taken along B-B' in FIG. 2.
Figure 5:
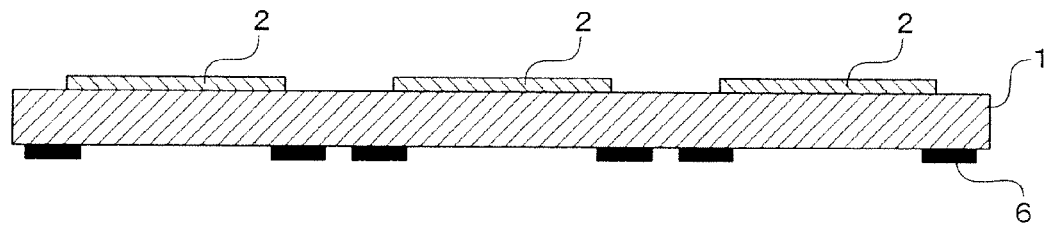
FIGS. 5(a)-(f) are process cross-sectional views showing the semiconductor substrate and a method of manufacturing a semiconductor device from the semiconductor substrate.
Figure 5:
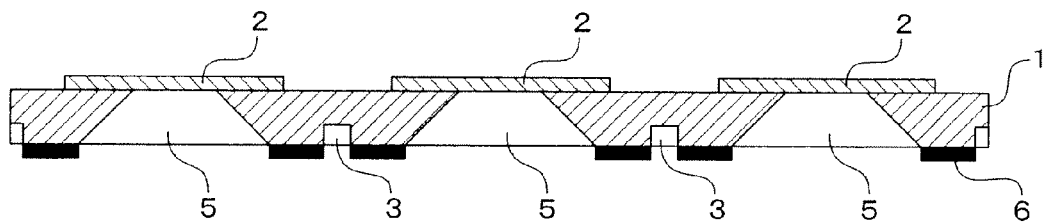
Figure 5:
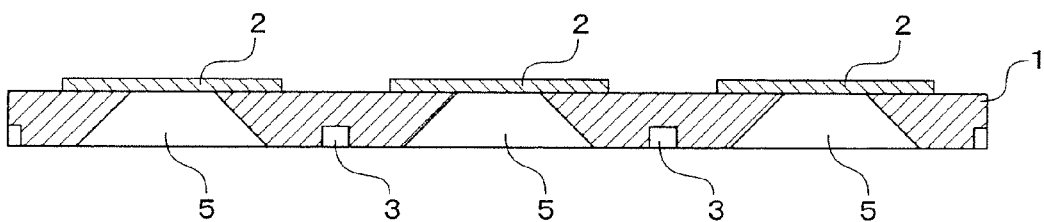
Figure 5:
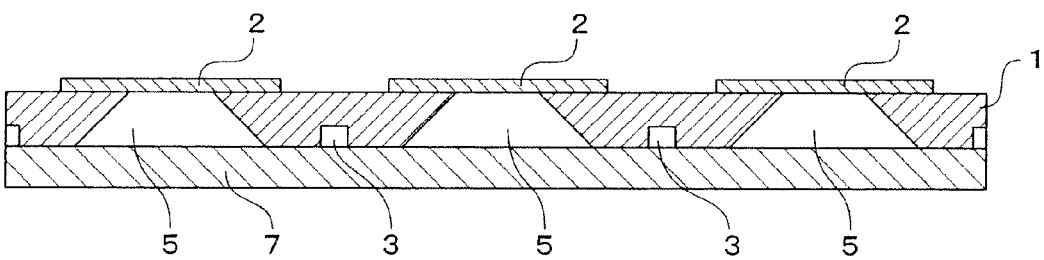
Figure 5:
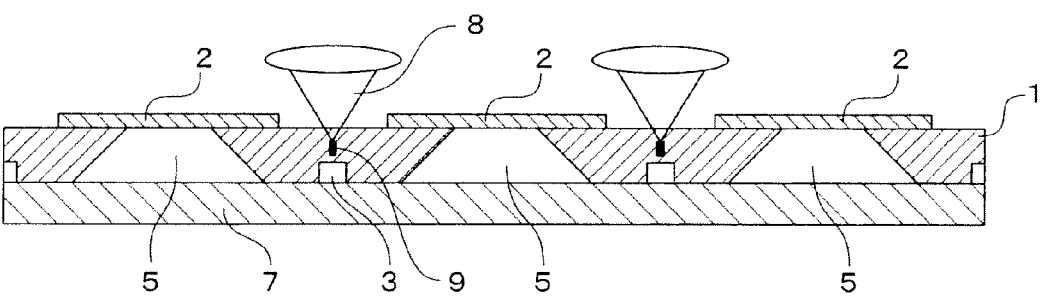
Figure 5:
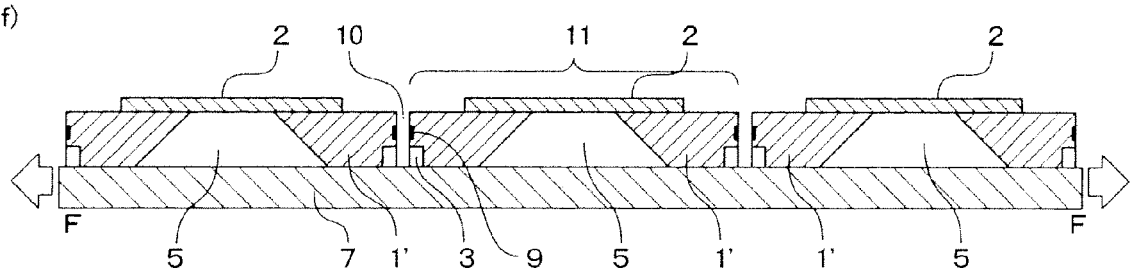

As shown in FIG. 5(a), etching masks 6 are formed on the semiconductor substrate 1 (refer to FIG. 1) on which the plurality of semiconductor elements 2 are formed in a grid pattern and separated by the separating lines 4. The etching masks 6 are formed by, for example, forming a silicon oxide film or the like by a CVD method and subsequently performing patterning using a lithographic technique so that apertures are provided in areas in which the aforementioned depressions 5 and the grooves 3 are to be formed. Although not shown, etching masks are to be retained across the entire surface of the face on which the semiconductor elements 2 are formed.

Next, as shown in FIG. 5(b), the depressions 5 and the grooves 3 are formed by anisotropic etching. For example, a KOH solution or a TMAH (tetra-methyl ammonium hydroxide) solution is used for anisotropic etching. At this point, since the grooves 3 are formed with the exception of the intersections of the separating lines 4 as described above, the grooves 3 do not have any intersecting portions. Thus, abnormal erosion attributable to intersecting does not occur and etch stop is possible at a desired depth even if the grooves 3 are formed concurrently with the depressions 5 having a different etching depth. In other words, the depth and the width of the grooves 3 are determined by the width of the aperture of the etching masks 6.

After etching is completed, the etching masks 6 are removed as shown in FIG. 5(c). While the removal is performed using a BHF solution or the like, the etching masks 6 may be retained if this does not pose any problems.

Subsequently, as shown in FIGS. 5(d) and 5(e), the semiconductor substrate 1 is mounted on a dicing tape 7, and a laser beam 8 is irradiated along each separating line 4 and at the same time focused on the inside of the semiconductor substrate 1 to form modified regions 9 inside the semiconductor substrate 1. At this point, the laser beam 8 is arranged to scan along the longitudinal direction of the grooves 3 while moving the focus of the laser beam 8 in the thickness-direction of the substrate so that microcracks originating at the modified regions 9 develop towards the grooves 3.

Finally, as shown in FIG. 5(f), by applying an external force F on the semiconductor substrate 1 on which the grooves 3 and the modified regions 9 are formed or, in other words, by applying the external force F that causes the dicing tape 7 to expand, cracks 10 originating at the modified regions 9 formed along each separating line 4 are generated to separate the semiconductor substrate 1 and to obtain individual semiconductor devices 11. If the aforementioned microcracks have developed to the grooves 3 prior to the external force F, the external force F may be reduced to enable processing with less energy.

Figure 6A:
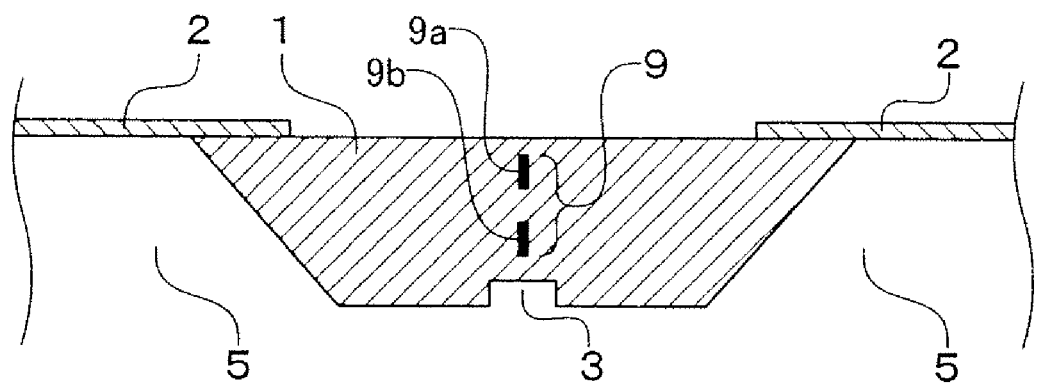
FIGS. 6A and B are cross-sectional views showing, in detail, a part of the method of manufacturing the semiconductor device.
Figure 6B:
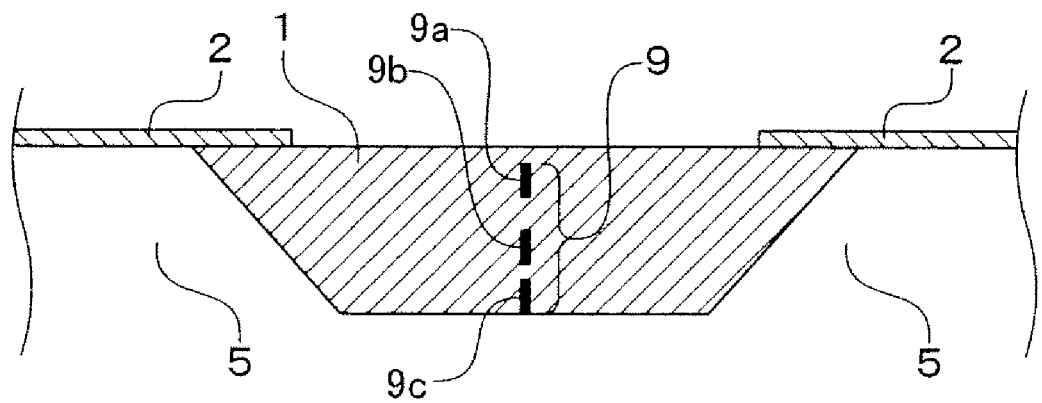

In a case where the semiconductor substrate 1 is thick, as shown in FIGS. 6A and 6B, separation can be facilitated by performing a plurality of number of scans by the laser beam 8 so that the modified regions 9 line up in the thickness direction of the substrate. Separation is also possible when reducing the number of scans by the laser beam 8 for formation portions of the grooves 3 in comparison to nonformation portions of the grooves 3. In this case, in the formation portions of the grooves 3, modified regions 9a and 9b are formed by setting the number of scans by the laser beam 8 to two, while in the nonformation portions of the grooves 3, modified regions 9a, 9b, and 9c are formed by setting the number of scans by the laser beam 8 to three.

According to the configuration of the semiconductor substrate 1 and the method of manufacturing the semiconductor device 11 described above, the following effects can be achieved. Since linearly-continuous grooves 3 are formed with the exception of portions corresponding to corners 15 for each semiconductor element 2, it is now possible to perform separation with superior rectilinearity in a stable and simple manner.

When forming a modified region 9 to become an origin of separation by the laser beam 8, the number of scans by the laser beam 8 for the formation portions of the grooves 3 can be reduced in comparison to the number of scans by the laser beam 8 for the nonformation portions of the grooves 3. As a result, process takt can be reduced.

Meanwhile, since crack formation is facilitated by forming modified regions 9 with the laser beam 8, the grooves 3 need not necessarily be given a V-groove shape for which etching control is extremely difficult, making stable etching possible with extreme ease. Since grooves 3 are not formed at portions corresponding to the corners 15 (intersecting portions of the separating lines 4), abnormal erosion during etching such as when grooves are also formed in these portions no longer occurs.

Since both grooves 3 and modified regions 9 are formed, separation with superior rectilinearity can be performed in a simple manner even when forming cracks by expansion or the like.

By forming the grooves 3 concurrently with the anisotropic etching process for forming the depressions 5, there is no particular increase in processes. Thus, increases in cost and lead-time can be avoided.

Figure 7:
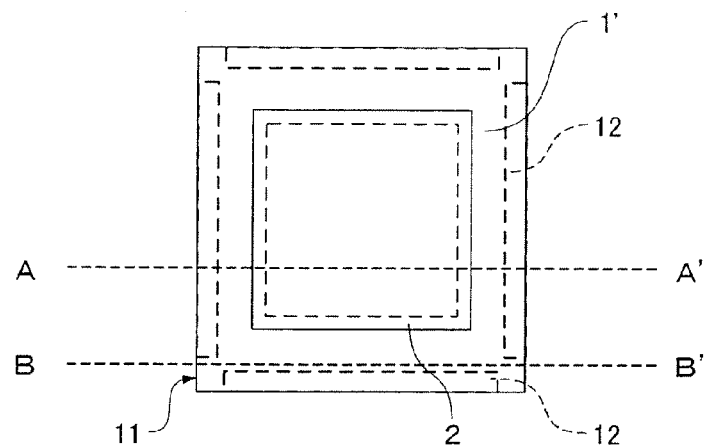
FIG. 7 is a plan view and cross-sectional views of the semiconductor device.
Figure 7:
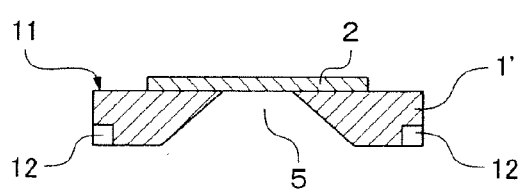
Figure 7:
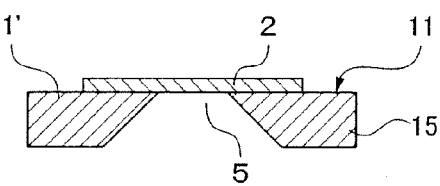

FIGS. 7(a), 7(b), and 7(c) show the semiconductor device 11 separated from the semiconductor substrate 1. A semiconductor element 2 and a depression 5 are formed on a semiconductor substrate 1', and each side of the rear face of the substrate opposing to the semiconductor element 2 with the exception of corners is provided with a notched portion (indentation) 12 therealong. The notched portion 12 is the aforementioned groove 3 segmented in the longitudinal direction.

Generally, a semiconductor device has a quadrangular shape as observed from a planar view. In a semiconductor device with an elongated quadrangular shape, a long side of the semiconductor device is susceptible to breakage and, in rare cases, breakage occurs at a short side. An origin of breakage is a crack created at an edge portion. However, since the edge portions of the semiconductor device 11 according to the present embodiment are provided with the notched portion 12 or, in other words, since edge portions exist both above original edge portions on the inward side thereof, cracks that become origins of breakage are unlikely to occur. Therefore, with the semiconductor device 11, cracking and chipping of the edge portions are suppressed, deflective strength is dramatically improved, and superior mechanical strength is achieved.

Figure 8A:
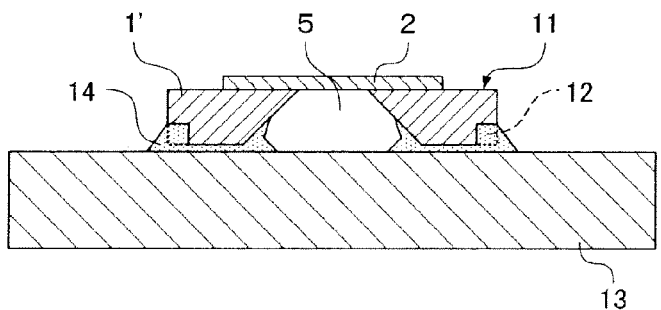
FIGS. 8A and B are cross-sectional views showing a state in which the semiconductor device is mounted on a mounting substrate.
Figure 8B:
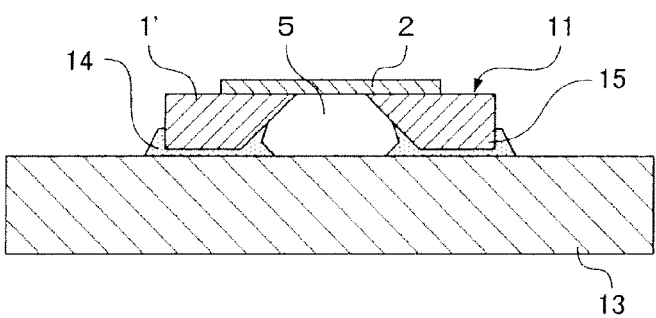

FIGS. 8A and 8B show a state in which the semiconductor device 11 is mounted on a mounting substrate 13. As per standard practice, the semiconductor device 11 and the mounting substrate 13 are bonded to each other by a die-bond material 14.

While bonding requires that an application quantity of the die-bond material 14 be stringently controlled so as to control the die-bond material 14 creeping up to a lateral face of the semiconductor device 11, since the notched portion 12 is provided at an edge portion, surface tension at the notched portion 12 suppresses creeping-up of the die-bond material 14. Consequently, management can be performed significantly easier in comparison to a case where the notched portion 12 is not provided.

Meanwhile, since the notched portion 12 is absent from the corners 15 of the semiconductor device 11, the actual area of the rear face of the semiconductor device 11 is not reduced. Instead, the existence of the notched portion increases the die-bond area, in turn increasing the die-bond adhesion force between the semiconductor device 11 and the mounting substrate 13. In addition, since the notched portion 12 is absent from the corners 15 of the semiconductor device 11, the thickness of the semiconductor device 11 can be detected in a conventional manner and the mounting height variation accuracy of the semiconductor device 11 can be controlled without variance in a conventional manner.

In the embodiment described above, while the semiconductor substrate 1 (and the semiconductor device 11) is provided with a diaphragm structure, it is obvious that a structure other than a diaphragm structure shall suffice. Besides a silicon substrate, the semiconductor substrate 1 may also be a compound semiconductor substrate.

Figure 9A:
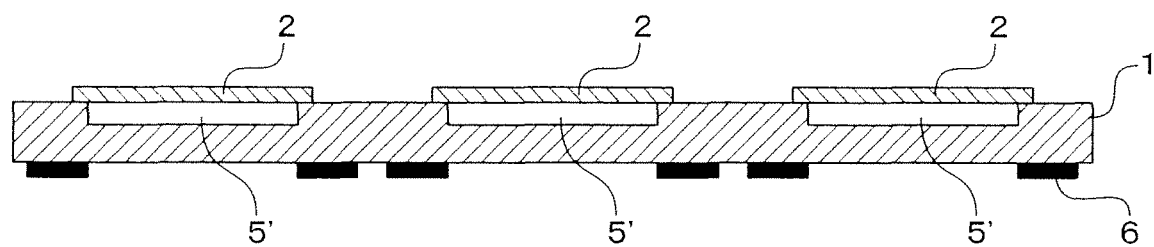
FIGS. 9A and B are process cross-sectional views showing another method of manufacturing a semiconductor device.
Figure 9B:
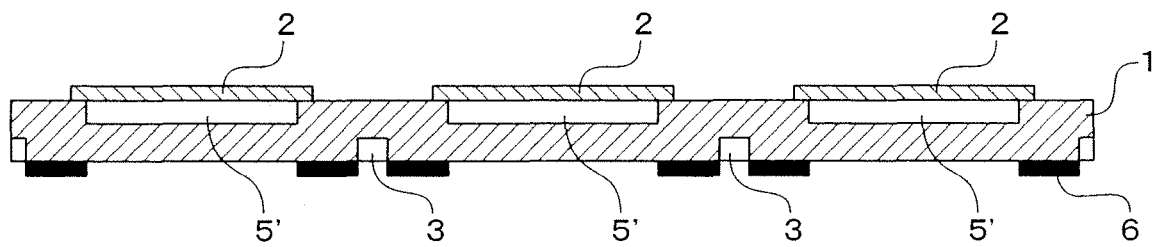

For example, when manufacturing an accelerometer as the semiconductor device 11, as shown in FIGS. 9A and 9B, a beam structure is adopted in which depressions 5' are formed on the upper face of the semiconductor substrate 1 and semiconductor elements 2 are placed at apertures of the depressions 5' while grooves 3 are formed on the lower face of the semiconductor substrate 1. Effects due to subsequent processes and the grooves 3 are the same as described above.

As described above, in the semiconductor substrate according to the present invention, continuous grooves are formed on longitudinal and lateral separating lines that individually separate a plurality of semiconductor elements with the exception of intersections of the separating lines such as portions corresponding to corners of each semiconductor element. Accordingly, since a structure is achieved in which the substrate is thin at the groove portions and stress can be more readily concentrated during separation using cleavages or the like, separation can now be performed with good rectilinearity and in a stable manner as compared to a semiconductor substrate not provided with such grooves. Since the grooves are not continuously formed along the entirety of the separating lines, strength deterioration or breakage of the semiconductor substrate is unlikely to occur.

In addition, in a method of manufacturing a semiconductor device according to the present invention, since the aforementioned grooves are formed or, in other words, since groove intersections where it is extremely difficult to control etching have been removed, the formation of the grooves can be performed in an extremely easy and stable manner. Since almost all of the grooves on the respective separating lines are to be linearly continuous, when forming modified regions to become origins of separation using a laser beam, separation can be performed with good rectilinearity in a stable manner and a reduction in process takt can be achieved even when reducing the number of scans by the laser beam on groove-formation portions in comparison to other portions.

When the method of manufacturing a semiconductor device according to the present invention includes the process of forming a depression constituting a diaphragm structure on a rear face-side of each semiconductor element by anisotropic etching, concurrently forming the grooves in the process of forming the depression shall suffice. Therefore, the formation of grooves does not increase the number of processes and increases in cost and lead-time can be avoided.

Accordingly, process takt can be improved without increasing process costs or degrading process quality.

Since a semiconductor device manufactured as described above has a notched portion that is continuous with the exception of corners on each side of the rear face of a substrate opposite to a semiconductor element, a die-bond material can be kept from creeping up to a lateral face of the device during mounting of the substrate. Since notched portions are absent from corners, there is no decrease in the area of the rear face of the device and a bonding area can be secured.

Next, another embodiment of the present invention will be described. In FIGS. 10 to 13, a semiconductor substrate 1 is made up of Si monocrystals, and a plurality of semiconductor elements 2 in which functional elements are constructed are formed in a grid pattern on one of faces of the semiconductor substrate 1. The portions of the semiconductor elements 2 become diaphragm pressure sensors (semiconductor devices) after separation. As such, the semiconductor elements 2 themselves are made thin so as to become sensing sections, while depressions 5 are formed on rear face-sides of the semiconductor elements 2, constituting diaphragm structures. An example of such a diaphragm pressure sensor is a microphone sensor, in which air vibrated by sound vibrates a diaphragm, and the displacement of the diaphragm varies the capacity of a conductor between a receiving-side diaphragm and a vibrating-side diaphragm to convert the sound into a vibrational frequency and an electrical signal.

Separating lines 4 separating the plurality of semiconductor elements 2 are separating areas set so as to separate the semiconductor substrate 1 into the semiconductor elements 2, and extend in longitudinal and lateral directions so as to bisect each other at right angles. On the rear face of the substrate opposing the semiconductor elements 2, linear grooves 3 are formed on the respective separating lines 4 with the exception of intersections of the separating lines 4. In this case, with the exception of outer peripheries of the respective semiconductor elements 2, continuous grooves 3 are formed only in the vicinity of the outer periphery of the substrate (substrate periphery).

The semiconductor substrate 1 and a method of manufacturing a semiconductor device will now be described.

Figure 14:
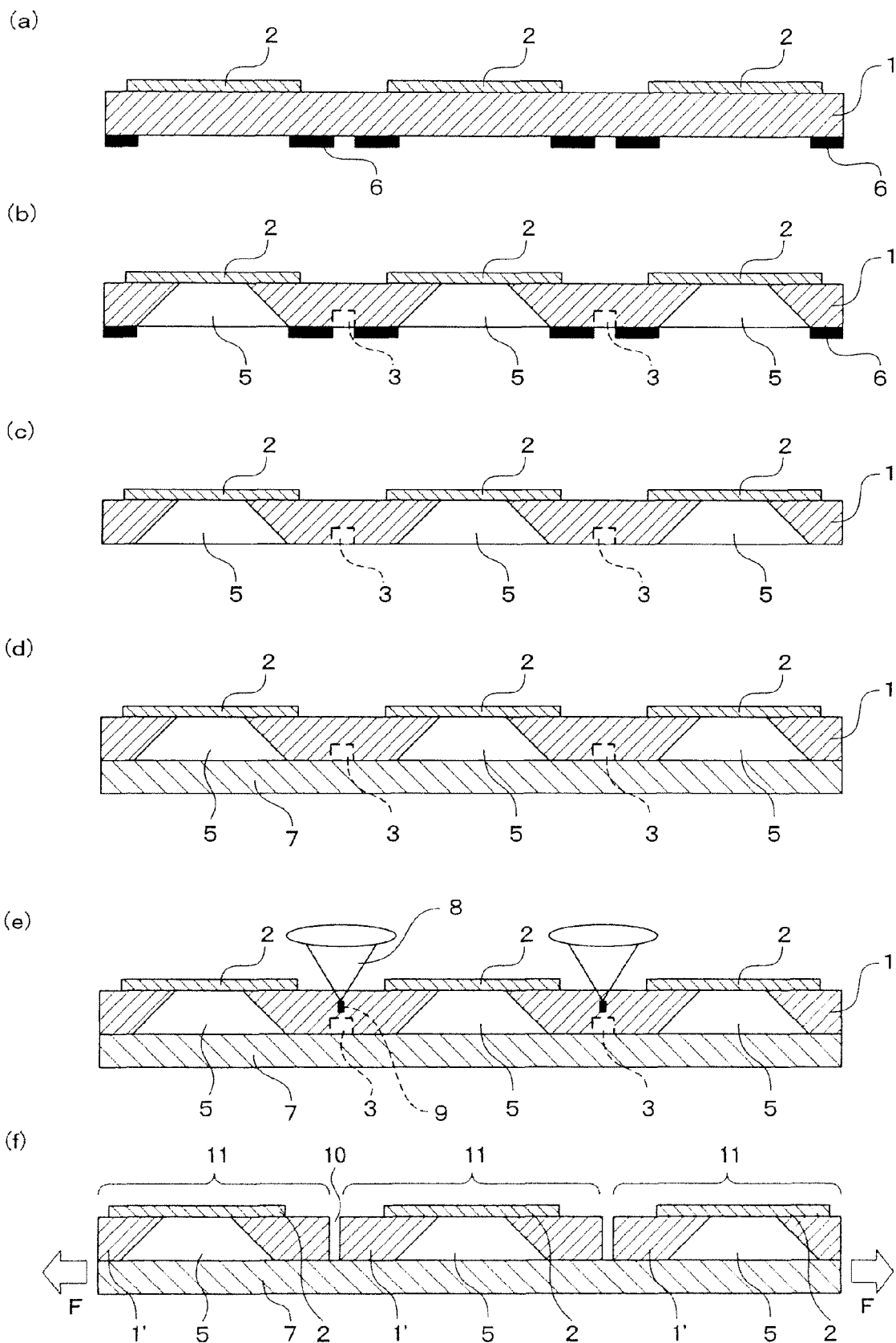
FIGS. 14(a)-(f) are process cross-sectional views showing the semiconductor substrate and a method of manufacturing a semiconductor device from the semiconductor substrate.

As shown in FIG. 14(a), etching masks 6 are formed on the semiconductor substrate 1 (refer to FIG. 10) on which the plurality of semiconductor elements 2 are formed in a grid pattern and separated by the separating lines 4. The etching masks 6 are formed by, for example, forming a silicon oxide film or the like by a CVD method and subsequently performing patterning using a lithographic technique so that apertures are provided in areas in which the aforementioned depressions 5 and the grooves 3 are to be formed. Although not shown, etching masks are to be retained across the entire surface of the face on which the semiconductor elements 2 are formed.

Next, as shown in FIG. 14(b), the depressions 5 and the grooves 3 are formed by anisotropic etching. For example, a KOH solution or a TMAH (tetra-methyl ammonium hydroxide) solution is used for anisotropic etching. At this point, since the grooves 3 are formed with the exception of outer peripheries of the respective semiconductor elements 2 and only on the separating lines 4 in the vicinity of the outer periphery of the substrate as described above, the grooves 3 do not have any intersecting portions. Thus, abnormal erosion attributable to intersecting does not occur and etch stop is possible at a desired depth even if the grooves 3 are formed concurrently with the depressions 5 having a different etching depth. In other words, the depth and the width of the grooves 3 are determined by the width of the apertures of the etching mask 6.

After etching is completed, the etching mask 6 is removed as shown in FIG. 14(c). While the removal is performed using a BHF solution or the like, the etching mask 6 may be retained if this does not pose any problems.

Subsequently, as shown in FIGS. 14(d) and 14(e), the semiconductor substrate 1 is mounted on a dicing tape 7, and a laser beam 8 is irradiated along each separating line 4 and at the same time focused on the inside of the semiconductor substrate 1 to form modified regions 9 inside the semiconductor substrate 1. At this point, the laser beam 8 is arranged to scan along the longitudinal direction of the grooves 3 while moving the focus of the laser beam 8 in the thickness-direction of the substrate so that microcracks originating at the modified regions 9 develop towards the grooves 3.

Finally, as shown in FIG. 14(f), by applying an external force F on the semiconductor substrate 1 on which the grooves 3 and the modified regions 9 are formed or, in other words, by applying an external force F that causes the dicing tape 7 to expand, cracks 10 originating at the modified regions 9 formed along each separating line 4 are developed to separate the semiconductor substrate 1 and to obtain individual semiconductor devices 11. If the aforementioned microcracks had developed to the grooves 3 prior to the external force F, the external force F may be reduced to enable processing with less energy.

Figure 15A:
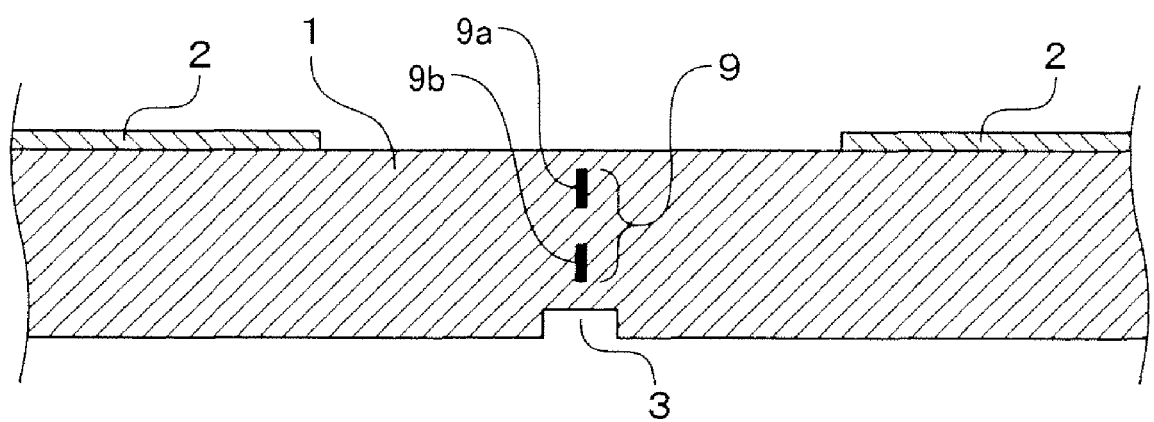
FIGS. 15A and B are cross-sectional views showing, in detail, a part of the method of manufacturing the semiconductor device.
Figure 15B:
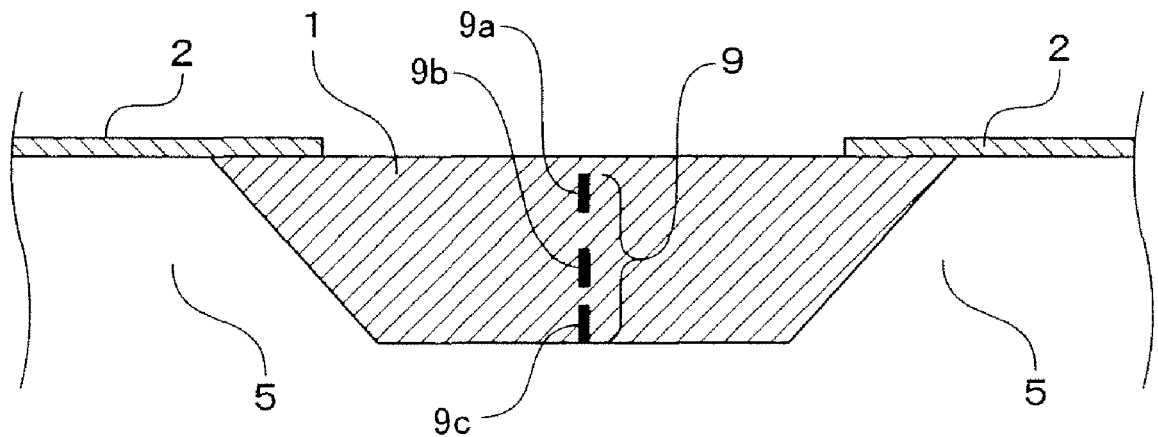

In a case where the semiconductor substrate 1 is thick, as shown in FIGS. 15A and 15B, separation can be facilitated by performing a plurality of number of scans by the laser beam 8 so that the modified regions 9 line up in the thickness direction of the substrate. Separation is also possible when reducing the number of scans by the laser beam 8 for formation portions of the grooves 3 in comparison to nonformation portions of the grooves 3. In this case, in the formation portions of the grooves 3, modified regions 9a and 9b are formed by setting the number of scans by the laser beam 8 to two, while in the nonformation portions of the grooves 3, modified regions 9a, 9b, and 9c are formed by setting the number of scans by the laser beam 8 to three.

According to the configuration of the semiconductor substrate 1 and the method of manufacturing the semiconductor device 11 described above, the following effects can be achieved. By forming the continuous grooves 3 only on the separating lines 4 in the vicinity of the outer periphery of the semiconductor substrate 1, a structure is achieved in which the substrate is thin at the portions of the grooves 3 and stress can be more readily concentrated during separation using cleavages or the like. As a result, separation can now be performed with good rectilinearity and in a stable manner as compared to a case where the grooves 3 are not formed. Since the grooves 3 are not continuously formed along the entirety of the separating lines 4, strength deterioration or breakage of the semiconductor substrate 1 is unlikely to occur.

Since the formation of the grooves 3 does not include groove intersections at which etching control is extremely difficult, abnormal erosion during etching such as when groove intersections are included no longer occurs. As a result, the grooves 3 can be formed significantly easily and in a stable manner, thereby achieving a reduction in process takt. Furthermore, since the formation of modified regions 9 in a subsequent stage enables cracks to be formed more easily, the grooves 3 need not necessarily be given a V-groove shape for which etching control is extremely difficult, making stable etching possible with extreme ease.

Similarly, when forming the modified regions 9, since the number of scans by the laser beam 8 for groove formation portions can be reduced in comparison to groove nonformation portions, the total number of scans can be reduced in comparison to a case where the grooves 3 are not formed and a reduction in process takt can be achieved.

Since the aforementioned grooves 3 become origins when performing separation, combined with the effect of providing modified regions 9, the risks of meandering of separating lines and chipping of the semiconductor device 11 after separation can be reduced in comparison with a case where the grooves 3 are not formed. As a result, separation with good rectilinearity can be easily performed to improve the quality of the semiconductor device 11. Traces of the grooves 3 do not remain on the semiconductor device 11 and the area of the rear face of the device does not decrease.

By forming the grooves 3 concurrently with the anisotropic etching process for forming the depressions 5, there is no particular increase in processes. Thus, increases in cost and lead-time can be avoided.

Figure 16:
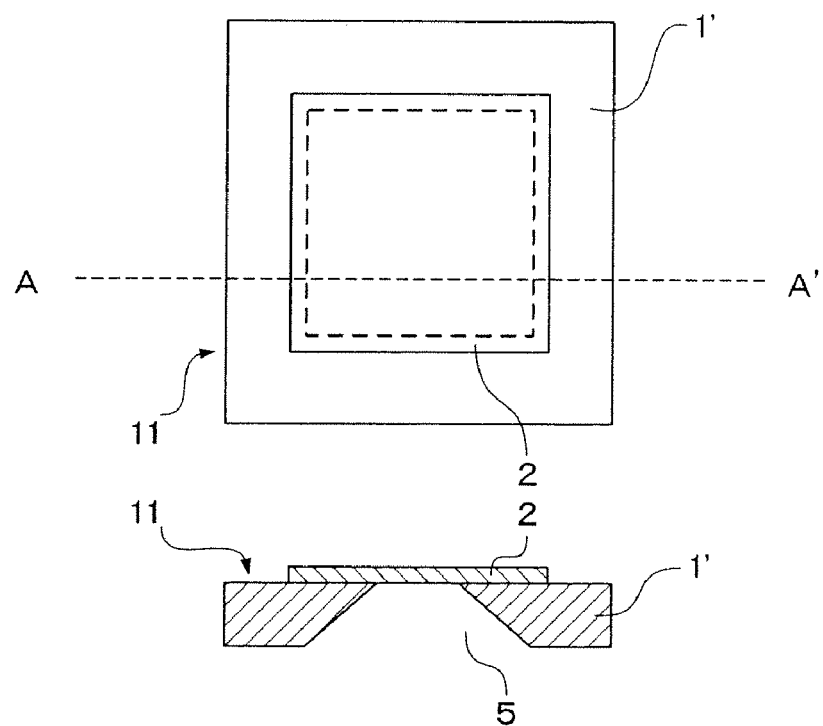
FIG. 16 is a plan view and cross-sectional views of the semiconductor device.
Figure 17:
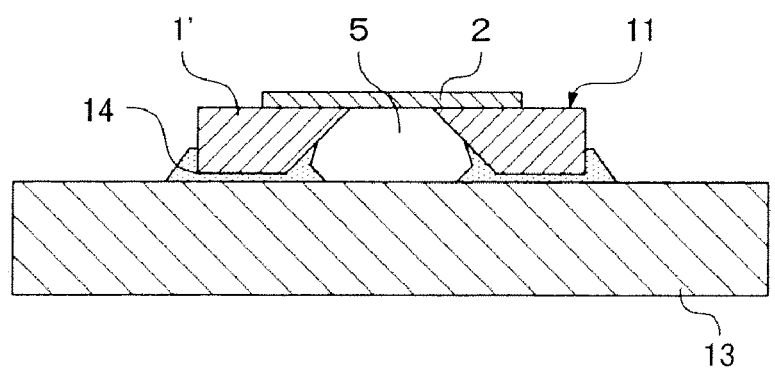
FIG. 17 is a cross-sectional view showing a state in which the semiconductor device is mounted on a mounting substrate.

FIG. 16 shows a semiconductor device 11 separated from the semiconductor substrate 1. A semiconductor element 2 and a depression 5 are formed on a semiconductor substrate 1'. FIG. 17 shows a state in which the semiconductor device 11 is mounted on a mounting substrate 13. As per standard practice, the semiconductor device 11 and the mounting substrate 13 are bonded to each other by a die-bond material 14. Since traces of the aforementioned grooves 3 do not remain on the semiconductor substrate 1' or, in other words, since the exterior shape of the semiconductor device 11 is as per conventional, the bonding area during die-bonding can be secured in a conventional manner, enabling die-bonding to be performed under the same die-bonding conditions as per conventional.

Moreover, in addition to the grooves 3 described above, a continuous groove may be formed on longitudinal and lateral separating lines of the semiconductor substrate 1 prior to separation, along the four sides of each semiconductor element 2 with the exception of portions corresponding to corners.

In this case also, since groove intersections where it is extremely difficult to control etching are not created, the formation of the grooves can be performed in an extremely easy and stable manner. In addition, since almost all of the grooves on the respective separating lines are to be linearly continuous, when forming modified regions to become origins of separation using a laser beam, separation can be performed with good rectilinearity in a stable manner and a reduction in process takt can be achieved even when reducing the number of scans by the laser beam on groove-formation portions in comparison to other portions. Because concurrently forming the grooves in the process of forming the depression 5 shall suffice, the formation of grooves does not increase the number of processes and increases in cost and lead-time can be avoided. Since notched portions that are traces of the grooves 3 are retained on the respective sides of the rear face of the semiconductor substrate 1' after separation but not on the corners, there is no decrease in the area of the rear face of the device and a bonding area can be secured.

In the embodiment described above, while the semiconductor substrate 1 (and the semiconductor device 11) is provided with a diaphragm structure, it is obvious that a structure other than a diaphragm structure shall suffice. Besides a silicon substrate, the semiconductor substrate 1 may also be a compound semiconductor substrate.

Figure 18A:
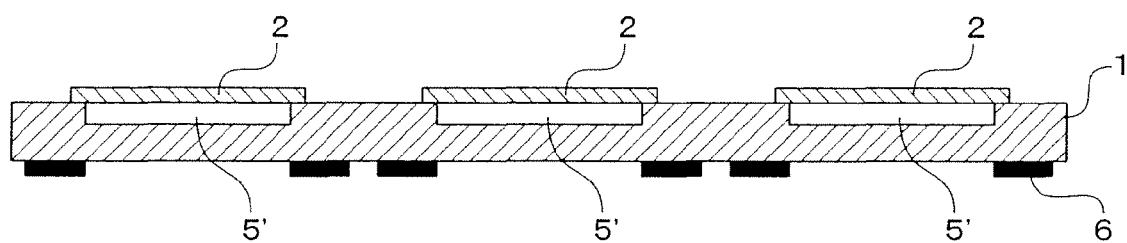
FIGS. 18A and B are process cross-sectional views showing another method of manufacturing a semiconductor device.
Figure 18B:
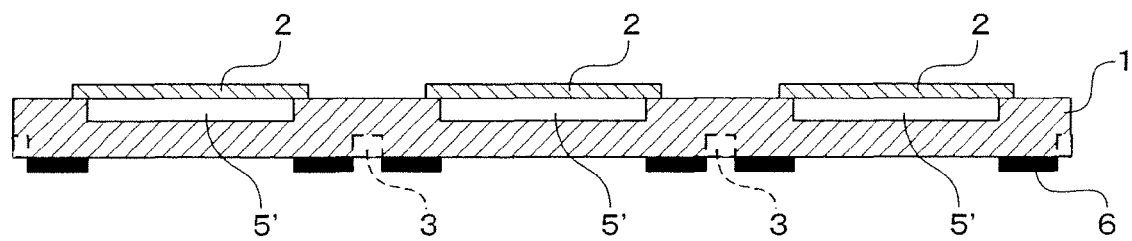
Figure 19A:
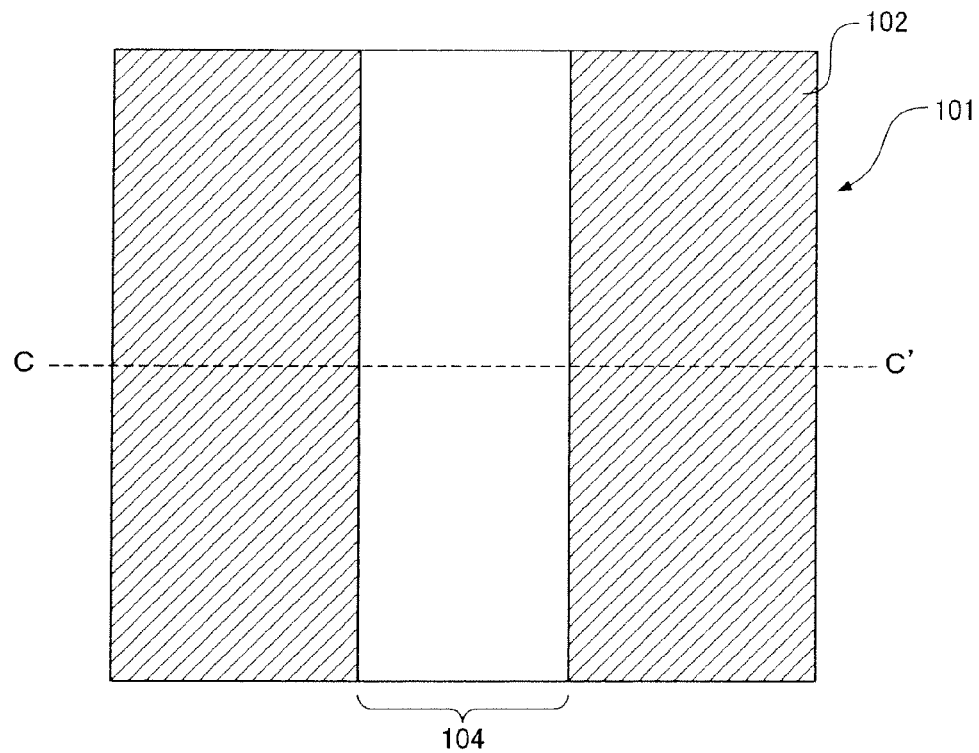
FIG. 19A is a plan view.
Figure 19B:
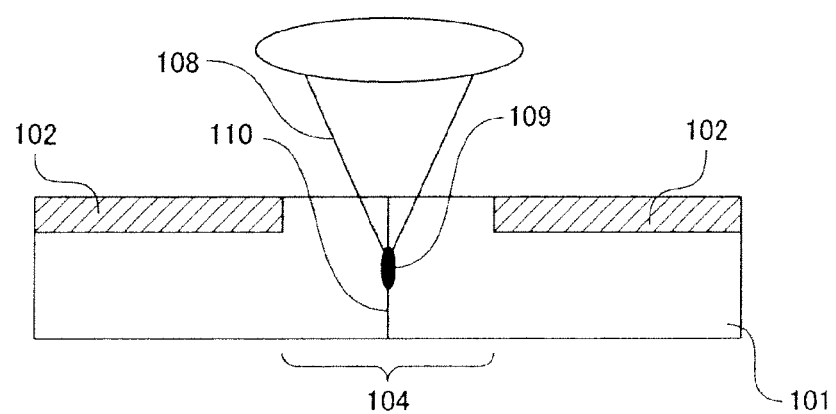
FIG. 19B is a cross-sectional view, showing a conventional semiconductor substrate and a method of separating the same.

For example, when manufacturing an accelerometer as the semiconductor device 11, as shown in FIGS. 18A and 18B, a beam structure is adopted in which depressions 5' are formed on the upper face of the semiconductor substrate 1 and semiconductor elements 2 are placed at apertures of the depressions 5' while grooves 3 are formed on the lower face of the semiconductor substrate 1. Effects due to subsequent processes and the grooves 3 are the same as described above.

As described above, in a semiconductor substrate according to the present invention, continuous grooves are formed on longitudinal and lateral separating lines that individually separate a plurality of semiconductor elements with the exception of intersections of the separating lines and, for example, portions corresponding to the outer periphery of each semiconductor element or, in other words, only in the vicinity of the outer periphery of the substrate. Accordingly, since a structure is achieved in which the substrate is thin at the groove portions and stress can be more readily concentrated during separation using cleavages or the like, separation can now be performed with good rectilinearity and in a stable manner as compared to a semiconductor substrate not provided with such grooves. Since the grooves are not continuously formed along the entirety of the separating lines, strength deterioration or breakage of the semiconductor substrate is unlikely to occur.

In addition, in a method of manufacturing a semiconductor device according to the present invention, since the aforementioned grooves are formed or, in other words, since groove intersections where it is extremely difficult to control etching have been removed, the formation of the grooves can be performed in an extremely easy and stable manner. Furthermore, when forming the modified regions, since the number of scans by the laser beam for groove formation portions can be reduced in comparison to groove nonformation portions, the total number of scans can be reduced in comparison to a case where the grooves are not formed. Moreover, since separation is performed using the aforementioned grooves in the vicinity of the outer periphery of the substrate as origins, the risks of meandering of the separating lines and chipping of the semiconductor device after separation can be reduced in comparison with a case where the grooves are not formed. As a result, separation with good rectilinearity and a reduction in process takt can be achieved. With the semiconductor device after separation, quality is improved, the area of the rear face of the device does not decrease since traces of grooves do not remain, and a bonding area during die-bonding can be secured.

When the method of manufacturing a semiconductor device according to the present invention includes the process of forming a depression constituting a diaphragm structure on a rear face-side of each semiconductor element by anisotropic etching, concurrently forming the grooves in the process of forming the depression shall suffice. Therefore, the formation of grooves does not increase the number of processes and increases in cost and lead-time can be avoided.

Accordingly, process takt can be improved without increasing process costs or degrading process qualities.

Moreover, the thickness of the semiconductor substrate is to be determined in accordance with the diameter of the semiconductor substrate or the thickness required by the semiconductor device after separation, and the depth of grooves are also to be determined according to the thickness of the semiconductor substrate. For example, in a case where the semiconductor device is a microphone sensor, if a Si monocrystalline substrate has a diameter of 4 to 12 inches and a thickness of 100 to 1000 um, and the desired semiconductor device has a planar size of approximately 1 to 200 mm$^2$ and a finished thickness of approximately 10 to 900 um, then the thickness of a planar diaphragm (referred to as a semiconductor element herein) is to be approximately 1 to 5 um at a receiving side and approximately 1 to 5 um at a vibrating side. Accordingly, the depressions can be formed by etching so that these thicknesses are made. The planar size of the depression is approximately 0.5 to 150 mm$^2$. In addition, the grooves can be arranged so as to have a width of approximately 20 to 500 um (the narrower the better in order to improve chip throughput) and a depth of approximately 10 to 890 um (although the deeper the better to facilitate division and separation, the depth is set at which cracking of the substrate does not unnecessarily occur).

Figure 10:
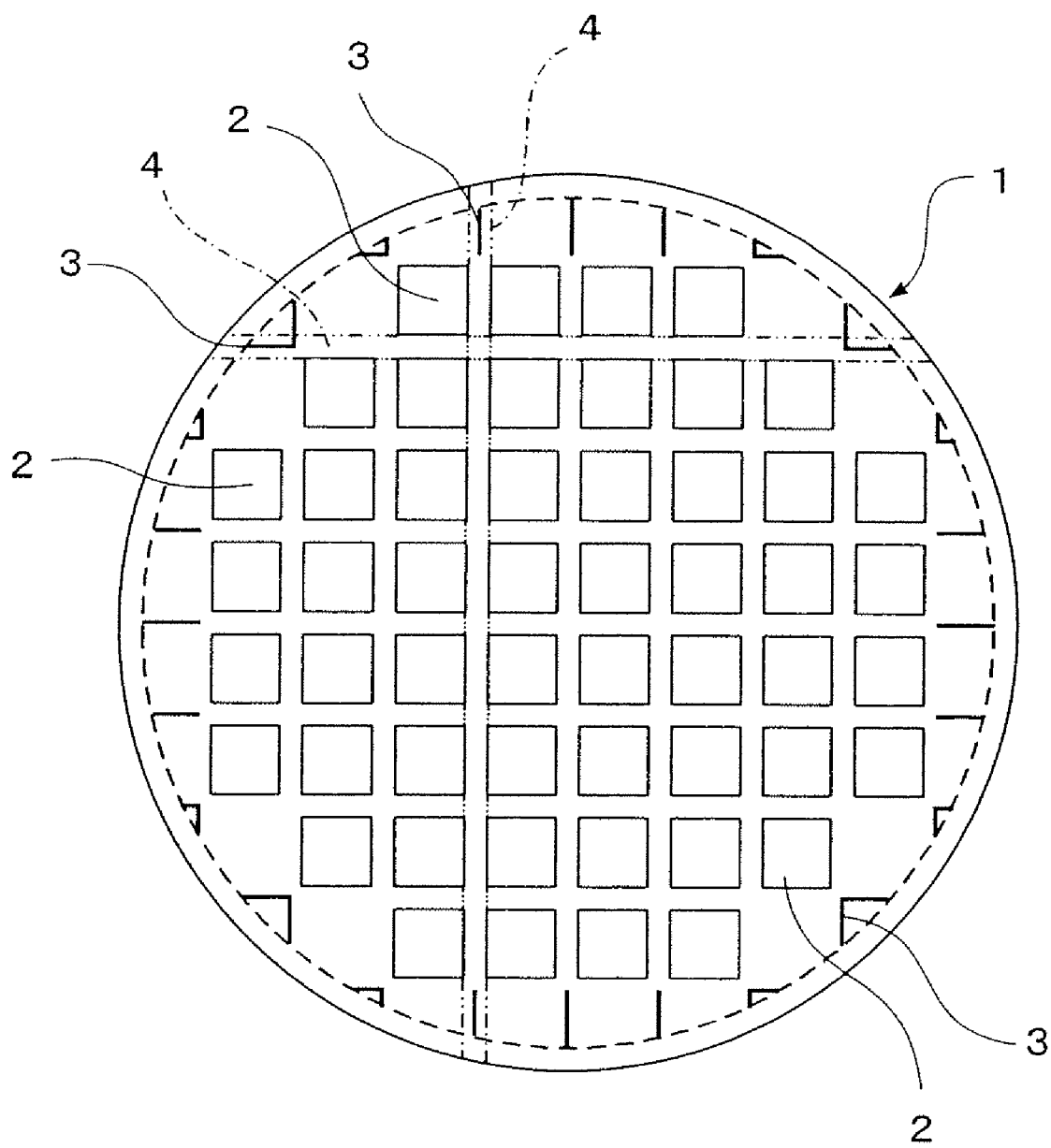
FIG. 10 is a plan view of a semiconductor substrate according to another embodiment of the present invention.
Figure 11:
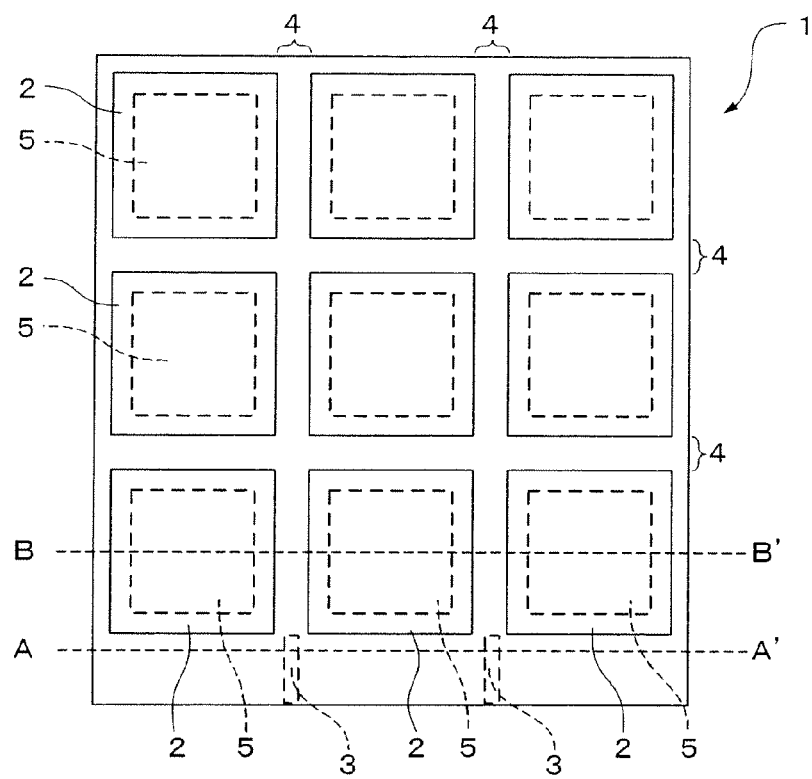
FIG. 11 is a partial enlarged plan view showing the semiconductor substrate.
Figure 12:
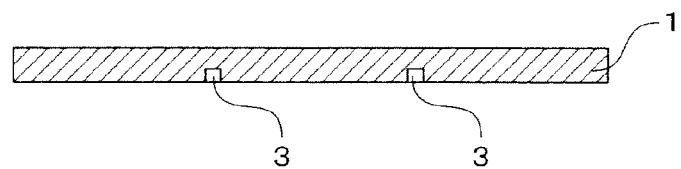
FIG. 12 is a cross-sectional view of the semiconductor substrate taken along A-A' in FIG. 11.
Figure 13:
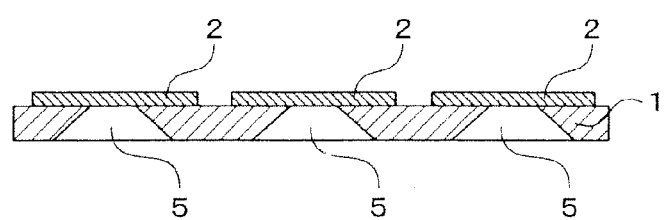
FIG. 13 is a cross-sectional view of the semiconductor substrate taken along B-B' in FIG. 11.

Albeit a dimensional range that does not partially overlap with the exemplification of the microphone sensor described above, favorable results were obtained with a semiconductor substrate 1 having a diameter of 3 to 12 inches, a thickness of 25 to 725 um, and a separating line width of 5 to 200 um when the grooves 3 shown in FIG. 10 were formed with a width of 5 to 200 um and a depth of 5 to 195 um. In the case where the thickness of the semiconductor substrate 1 was 300 um, favorable results were obtained by scanning the laser beam 8 0 to 10 times (the small numbers of scans are performed for groove formation portions).

What is claimed is:

1. A semiconductor substrate on which a plurality of semiconductor elements each containing functional elements are located in a grid pattern, having a diaphragm structure provided with a depression on a rear face-side of each semiconductor element, with linear grooves in the semiconductor substrate extending along longitudinal and lateral lines individually separating the plurality of semiconductor elements with the exception of intersections of the separating lines.

2. The semiconductor substrate according to claim 1, wherein the grooves are continuously formed with the exception of portions corresponding to corners of each semiconductor device.

3. The semiconductor substrate according to claim 1, wherein the grooves are continuously formed with the exception of portions corresponding to an outer periphery of each semiconductor device.

* * * * *